US011622445B2

(12) United States Patent
Yoon et al.

(10) Patent No.: US 11,622,445 B2
(45) Date of Patent: Apr. 4, 2023

(54) SURFACE-TREATED COPPER FOIL, MANUFACTURING METHOD THEREOF, COPPER FOIL LAMINATE INCLUDING THE SAME, AND PRINTED WIRING BOARD INCLUDING THE SAME

(71) Applicant: Iljin Materials Co., Ltd., Iksan-si (KR)

(72) Inventors: Sang Hwa Yoon, Iksan-si (KR); Chang Yol Yang, Iksan-si (KR); Jung Woo Seo, Iksan-si (KR); Young Ho Ryu, Iksan-si (KR); Kideok Song, Iksan-si (KR); Eun Sil Choi, Iksan-si (KR); Won Jin Beom, Iksan-si (KR); Hyung Cheol Kim, Iksan-si (KR)

(73) Assignee: ILJIN MATERIALS CO., LTD., Jeollabuk-Do (KR)

( * ) Notice: Subject to any disclaimer, the term of this patent is extended or adjusted under 35 U.S.C. 154(b) by 0 days.

(21) Appl. No.: 17/125,329

(22) Filed: Dec. 17, 2020

(65) Prior Publication Data
US 2021/0195737 A1    Jun. 24, 2021

(30) Foreign Application Priority Data

Dec. 19, 2019  (KR) .................. 10-2019-0170662

(51) Int. Cl.
*B32B 15/08* (2006.01)
*C25D 3/38* (2006.01)
(Continued)

(52) U.S. Cl.
CPC ............... *H05K 1/09* (2013.01); *B32B 15/08* (2013.01); *B32B 15/20* (2013.01); *C25D 3/38* (2013.01);
(Continued)

(58) Field of Classification Search
CPC ......... H05K 1/0306; H05K 2201/0338; H05K 3/384; H05K 1/0242; H05K 2203/0723;
(Continued)

(56) References Cited

U.S. PATENT DOCUMENTS

2005/0019599 A1*  1/2005  Moteki ................ C25D 7/0614
                                                   428/626
2014/0355229 A1* 12/2014  Arai ....................... H05K 1/056
                                                   428/458
(Continued)

FOREIGN PATENT DOCUMENTS

JP    2005206915 A    8/2005
JP    2015061934 A    4/2015
(Continued)

*Primary Examiner* — Seth Dumbris
(74) *Attorney, Agent, or Firm* — Husch Blackwell LLP

(57) ABSTRACT

Provided are: a surface-treated copper foil including a surface-treated layer formed on at least one side of an untreated copper foil and an oxidation preventing layer formed on the surface-treated layer, wherein the surface-treated layer contains copper particles having an average particle diameter of about 10 nm to about 100 nm and has a 10-point average roughness, Rz, of about 0.2 μm to about 0.5 μm and a gloss (Gs 60°) of about 200 or more, and the oxidation preventing layer contains nickel (Ni) and phosphorus (P); a manufacturing method thereof; a copper foil laminate including the same; and a printed wiring board including the same.

9 Claims, 2 Drawing Sheets

(51) Int. Cl.
- *H05K 1/09* (2006.01)
- *H05K 3/38* (2006.01)
- *B32B 15/20* (2006.01)
- *C25D 7/00* (2006.01)
- *H05K 1/02* (2006.01)

(52) U.S. Cl.
CPC ............... *C25D 7/00* (2013.01); *H05K 3/384* (2013.01); *B32B 2255/06* (2013.01); *B32B 2255/205* (2013.01); *B32B 2457/08* (2013.01); *H05K 1/0242* (2013.01); *H05K 2201/0338* (2013.01); *H05K 2203/0723* (2013.01); *Y10T 428/12431* (2015.01)

(58) Field of Classification Search
CPC ............ B32B 3/30; B32B 7/12; B32B 15/04; B32B 15/20; B32B 2250/02; B32B 2457/08; B32B 15/08; B32B 2255/06; B32B 2255/205; C25D 5/16; C25D 1/04; C25D 3/38; C25D 7/0614; C25D 7/00; Y10T 428/12431; Y10T 428/12438; Y10T 428/24612; Y10T 428/31678; H01K 1/09

USPC .................................................. 428/172, 457
See application file for complete search history.

(56) References Cited

U.S. PATENT DOCUMENTS

| 2015/0245477 A1* | 8/2015 | Arai ..................... C25D 7/0692 |
| | | 428/209 |
| 2018/0160546 A1* | 6/2018 | Ori ....................... H05K 3/4661 |

FOREIGN PATENT DOCUMENTS

| JP | 2015061935 A | * | 4/2015 | ............. B32B 15/08 |
| JP | 2015092014 A | * | 5/2015 | ............. B32B 15/08 |
| JP | 5855259 B2 | * | 2/2016 | ............... B21B 1/40 |
| JP | 6248231 B1 | | 12/2017 | |
| JP | 2018141229 A | | 9/2018 | |
| JP | 2019525006 A | | 9/2019 | |
| TW | 201406228 A | | 2/2014 | |
| TW | 201546302 A | | 12/2015 | |
| WO | WO-2013187420 A1 | * | 12/2013 | ............. B32B 15/08 |
| WO | WO-2014073694 A1 | * | 5/2014 | ............... B21B 1/40 |

* cited by examiner

SURFACE-TREATED COPPER FOIL, MANUFACTURING METHOD THEREOF, COPPER FOIL LAMINATE INCLUDING THE SAME, AND PRINTED WIRING BOARD INCLUDING THE SAME

CROSS-REFERENCE TO RELATED APPLICATION

This application claims the benefit of Korean Patent Application No. 10-2019-0170662, filed on Dec. 19, 2019 in the Korean Intellectual Property Office, the entire disclosures of which are incorporated herein by reference.

BACKGROUND

Field of the Invention

The present invention relates to a surface-treated copper foil, a manufacturing method thereof, a copper foil laminate including the same, and a printed wiring board including the same, and more particularly, to a surface-treated copper foil suitable as a high-frequency foil due to having excellent adhesive strength with a resin substrate and low transmission loss, a manufacturing method thereof, a copper foil laminate including the same, and a printed wiring board including the same.

Discussion of Related Art

With the acceleration of downsizing and weight reduction of electric/electronic devices, printed circuits formed on substrates have become more sophisticated, highly integrated, and downsized, and accordingly, various physical properties are required for copper foils used in printed circuit boards.

Composite board materials used in the manufacture of flexible boards, multilayer boards for high-density mounting, high-frequency circuit boards, and the like (hereinafter, these boards are collectively referred to as "circuit boards" or "printed wiring boards") used in electric/electronic devices are formed of a conductor (copper foil) and an insulating substrate (that includes a film) supporting the conductor, and the insulating substrate secures insulation between conductors and has enough strength to support components.

Recently, as the speed of signal transmission to a circuit board increases, and accordingly the characteristic impedance, signal transmission speed, etc. of an insulating material forming the circuit board become more important, it is necessary to improve properties of the insulating material, such as a dielectric constant and dielectric loss.

Meanwhile, conventionally, in order to increase the low adhesive strength with respect to a resin, a method of amplifying current flow during surface treatment and increasing the deposition amount of granular copper during the surface treatment to increase 10-point average roughness, Rz, was used. Although this method may be suitable as a method of improving adhesive strength, the method is not suitable for circuit boards where high-frequency characteristics are important and has disadvantages in that when a surface of a copper foil is excessively treated to increase adhesive strength, factors that interfere with the transmission of high-frequency signals may increase, and signal transmission may be adversely affected.

SUMMARY OF THE INVENTION

The present invention is directed to providing a surface-treated copper foil suitable as a high-frequency foil due to having excellent adhesive strength with a resin substrate and low transmission loss, a manufacturing method thereof, a copper foil laminate including the same, and a printed wiring board including the same.

One aspect of the present invention provides a surface-treated copper foil. The surface-treated copper foil includes: a surface-treated layer formed on at least one side of an untreated copper foil; and an oxidation preventing layer formed on the surface-treated layer, wherein the surface-treated layer may contain copper particles having an average particle diameter of about 10 nm to about 100 nm and have a 10-point average roughness, Rz, of about 0.2 μm to about 0.5 μm and a gloss (Gs 60°) of about 200 or more, and the oxidation preventing layer may contain nickel (Ni) and phosphorus (P).

In the first embodiment, the untreated copper foil may be an electrolytic copper foil.

In the first or second embodiment, the surface-treated copper foil may satisfy Formula 1:

$$\text{about } 0 \text{ μm} \leq A2 - A1 \leq \text{about } 0.2 \text{ μm} \quad \text{<Formula 1>}$$

wherein Formula 1, A1 is a 10-point average roughness, Rz, before the surface treatment of the copper foil, and A2 is a 10-point average roughness, Rz, after the surface treatment of the copper foil.

In any one of the first to third embodiments, the surface-treated copper foil may satisfy Formula 2:

$$\text{about } 10 \leq B1 - B2 \leq \text{about } 200 \quad \text{<Formula 2>}$$

wherein Formula 2, B1 is a gloss (Gs 60°) before the surface treatment of the copper foil, and B2 is a gloss (Gs 60°) after the surface treatment of the copper foil.

In any one of the first to fourth embodiments, the surface-treated copper foil may have an adhesive strength of about 1.0 kgf/cm or more with a polyimide (PI) film or a polytetrafluoroethylene (PTFE) film.

In any one of the first to fifth embodiments, the surface-treated copper foil may have a transmission loss (S21) of about 3.0 dB/100 mm or less at 20 GHz.

Another aspect of the present invention provides a method of manufacturing the surface-treated copper foil of any one of the first to sixth embodiments. The method may include immersing an untreated copper foil in an aqueous solution containing a copper salt at about 10 g/L to about 60 g/L and an additive at about 50 g/L to about 200 g/L and carrying out electroplating at a solution temperature of about 25° C. to about 45° C., a pH of about 1 to about 7, and a current density of about 5 A/dm2 to about 10 A/dm2 and thus forming a surface-treated layer, wherein the copper salt may include copper sulfate, copper nitrate, copper chloride, copper acetate, or a combination thereof, and the additive may include citric acid, ethylenediaminetetraacetic acid, nitrilotriacetic acid, tartaric acid, a salt thereof, or a combination thereof.

Still another aspect of the present invention provides a copper foil laminate. The copper foil laminate may be formed by laminating, on a resin substrate, the surface-treated copper foil of any one of the first to sixth embodiments or the surface-treated copper foil manufactured by the method of the seventh embodiment.

Yet another aspect of the present invention provides a printed wiring board. The printed wiring board may be formed using the copper foil laminate of the eighth embodiment.

The present invention has an effect of providing a surface-treated copper foil suitable as a high-frequency foil due to having excellent adhesive strength with a resin substrate and low transmission loss, a manufacturing method thereof, a copper foil laminate including the same, and a printed wiring board including the same.

DETAILED DESCRIPTION OF EXEMPLARY EMBODIMENTS

Figure 1:
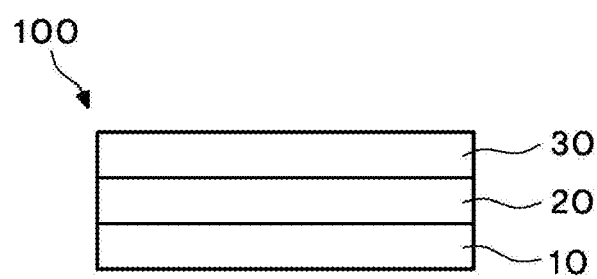
FIG. 1 is a schematic view of a surface-treated copper foil according to one embodiment of the present invention.
Figure 2:
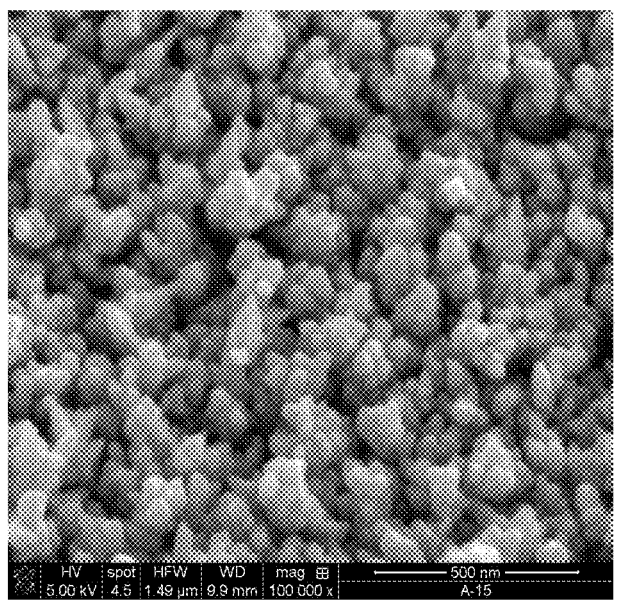
FIG. 2 is a scanning electron microscope (SEM) image of a copper foil of Example 2 after surface treatment.
Figure 3A:
FIG. 3A is a photograph of a copper foil of Example 2 after surface treatment.
Figure 3B:
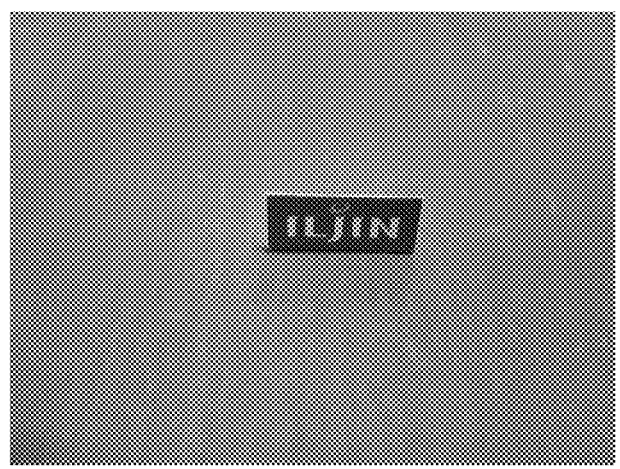
FIG. 3B is a photograph of a copper foil of Comparative Example 3 after surface treatment.

In the present specification, singular expressions include plural expressions unless the context clearly indicates otherwise.

Throughout the specification, like reference numerals refer to like components. In addition, in describing the present invention, when it is determined that a detailed description of related known techniques may obscure the gist of the present invention, the detailed description will be omitted.

In describing the positional relationship of two parts, when one part is described as being "on top of," "above," "below," or "next to" the other part, there may be one or more other parts present between the two parts unless expressions such as "immediate(ly)" and "direct(ly)" are used.

In describing the drawings, positional relationships described using expressions such as "upper portion," "top surface," "lower portion," and "bottom surface" are described based on the drawings and do not represent absolute positional relationships. That is, depending on points of observation, the "upper portion" may become a "lower portion" and vice versa, or the "top surface" may become a "bottom surface" and vice versa.

In the present specification, expressions such as "including," "containing," and "having" mean that the features or components described in the specification are present, and do not preclude the possibility of the addition of one or more other features or components.

In the present specification, when interpreting components, all ranges are interpreted as inclusive of the range of errors, even if not explicitly stated.

In the present specification, the expression "range of a to b" used for representing a numerical range defines a range of numbers which are greater than or equal to a and less than or equal to b.

The inventors of the present invention have found that when a surface-treated copper foil includes a surface-treated layer formed on at least one side of an untreated copper foil and an oxidation preventing layer formed on the surface-treated layer, and the surface-treated layer contains copper particles having an average particle diameter of about 10 nm to about 100 nm and has a 10-point average roughness, Rz, of about 0.2 μm to about 0.5 μm and a gloss (Gs 60°) of about 200 or more, and the oxidation preventing layer contains nickel (Ni) and phosphorus (P), the surface-treated copper foil has excellent adhesive strength with a resin substrate and low signal transmission loss in a high-frequency band and thus is suitable as a high-frequency foil, and thereby completed the present invention. Hereinafter, the present invention will be described in more detail.

Untreated Copper Foil

As the untreated copper foil, a known copper foil may be used without limitation.

According to one embodiment, the untreated copper foil may be an electrolytic copper foil, but the present invention is not limited thereto.

The thickness of the untreated copper foil is not particularly limited and may vary depending on the intended use of the surface-treated copper foil. For example, when the surface-treated copper foil is to be used in a printed wiring board, the thickness of the untreated copper foil may be in the range of about 6 μm to about 300 μm, for example, about 18 μm to about 70 μm, but the present invention is not limited thereto.

Surface-Treated Layer

The surface-treated layer may contain copper particles having an average particle diameter of about 10 nm to about 100 nm (e.g., 10 nm, 20 nm, 30 nm, 40 nm, 50 nm, 60 nm, 70 nm, 80 nm, 90 nm, or 100 nm). When the range is satisfied, the surface-treated copper foil can have excellent adhesive strength with a resin substrate and low transmission loss and thus can be suitable as a high-frequency foil. Here, the "average particle diameter" may be calculated by obtaining an SEM image of the surface-treated layer and measuring the particle diameter of copper particles through image analysis and may be calculated based on a total of 100 particles. The average particle diameter of copper particles contained in the surface-treated layer may be in the range of about 20 nm to about 100 nm according to one example and in the range of about 50 nm to about 100 nm according to another example, but the present invention is not limited thereto.

The 10-point average roughness, Rz, of the surface-treated layer may be in the range of about 0.2 μm to about 0.5 μm (e.g., 0.2 μm, 0.25 μm, 0.3 μm, 0.35 μm, 0.4 μm, 0.45 μm, or 0.5 μm), and the gloss (Gs 60°) of the surface-treated layer may be about 200 or more. When the ranges are satisfied, the surface-treated copper foil can have excellent adhesive strength with a resin substrate and low transmission loss and thus can be suitable as a high-frequency foil. Here, the "10-point average roughness, Rz" may refer to a 10-point average roughness, Rz, defined as a 10-point average roughness defined and specified in "5.1 Definition and Presentations of Surface Roughness" of JIS B 0601-1994, and the "gloss (Gs 60°)" may refer to a value obtained, in accordance with JIS Z 874, by irradiating a surface of a copper foil with measurement light at an incident angle of 60° and measuring the intensity of light reflected at a reflection angle of 60°. The 10-point average roughness, Rz, of the surface-treated layer may be in the range of about 0.25 μm to about 0.5 μm according to one example and in the range of about 0.3 μm to about 0.45 μm according to another example, and the gloss (Gs 60°) may be in the range of about 200 to about 400 (200, 210, 220, 230, 240, 250, 260, 270, 280, 290, 300, 310, 320, 330, 340, 350, 360, 370, 380, 390, or 400 according to one example and in the range of about 220 to about 380 according to another example), but the present invention is not limited thereto.

The surface treatment method is not particularly limited, but for example, the surface-treated layer may be formed by electroplating the untreated copper foil. As an electrolyte, an aqueous solution containing a copper salt at about 10 g/L to about 60 g/L (10 g/L, 20 g/L, 30 g/L, 40 g/L, 50 g/L, or 60 g/L according to one example and about 20 g/L to about 50 g/L according to another example) and an additive at about 50 g/L to about 200 g/L (50 g/L, 60 g/L, 70 g/L, 80 g/L, 90 g/L, 100 g/L, 110 g/L, 120 g/L, 130 g/L, 140 g/L, 150 g/L, 160 g/L, 170 g/L, 180 g/L, 190 g/L, or 200 g/L according to one example and about 70 g/L to about 180 g/L according to another example), for example, one whose pH has been adjusted within the range of about 1 to about 7 (1, 2, 3, 4, 5, 6, or 7 according to one example and about 5 to about 7 according to another example), may be used. Examples of types of the copper salt may include copper sulfate, copper nitrate, copper chloride, copper acetate, and the like, and examples of types of the additive may include citric acid, ethylenediaminetetraacetic acid, nitrilotriacetic acid, tartaric acid, a salt thereof (e.g., sodium citrate, disodium ethylenediaminetetraacetate, etc.), and the like, but the present invention is not limited thereto. The electroplating may be carried out by, for example, immersing an insoluble electrode used as a positive electrode and the untreated copper foil used as a negative electrode in the electrolyte and inducing electrolysis at a solution temperature of about 25° C. to about 45° C. (e.g., 25° C., 30° C., 35° C., 40° C., or 45° C.) and a current density of about 5 A/dm$^2$ to about 10 A/dm$^2$ (e.g., 5 A/dm$^2$, 6 A/dm$^2$, 7 A/dm$^2$, 8 A/dm$^2$, 9 A/dm$^2$, or 10 A/dm$^2$) for, for example, about 5 seconds to about 10 seconds (e.g., 5 seconds, 6 seconds, 7 seconds, 8 seconds, 9 seconds, or 10 seconds), but the present invention is not limited thereto.

According to one embodiment, the copper foil including the surface-treated layer may satisfy Formula 1:

$$\text{about } 0 \text{ μm} \leq A2-A1 \leq \text{about } 0.2 \text{ μm} \qquad \text{<Formula 1>}$$

In Formula 1, A1 is a 10-point average roughness, Rz, before the surface treatment of the copper foil, and A2 is a 10-point average roughness, Rz, after the surface treatment of the copper foil. When the range is satisfied, the surface-treated copper foil can have excellent adhesive strength with a resin substrate and low transmission loss and thus can be suitable as a high-frequency foil. For example, the difference in the 10-point average roughness, Rz, of the copper foil before and after surface treatment as represented by Formula 1 may be 0 μm, 0.01 μm, 0.02 μm, 0.03 μm, 0.04 μm, 0.05 μm, 0.06 μm, 0.07 μm, 0.08 μm, 0.09 μm 0.1 μm, 0.11 μm, 0.12 μm, 0.13 μm, 0.14 μm, 0.15 μm, 0.16 μm, 0.17 μm, 0.18 μm, 0.19 μm, or 0.2 μm according to one example, in the range of about 0 μm to about 0.15 μm according to another example, and in the range of about 0 μm to about 0.1 μm according to still another example, but the present invention is not limited thereto.

According to one embodiment, the copper foil including the surface-treated layer may satisfy Formula 2:

$$\text{about } 10 \leq B1-B2 \leq \text{about } 200 \qquad \text{<Formula 2>}$$

In Formula 2, B1 is a gloss (Gs 60°) before the surface treatment of the copper foil, and B2 is a gloss (Gs 60°) after the surface treatment of the copper foil. When the range is satisfied, the surface-treated copper foil can have excellent adhesive strength with a resin substrate and low transmission loss and thus can be suitable as a high-frequency foil. For example, the difference in the gloss of the copper foil before and after surface treatment as represented by Formula 2 may be 10, 20, 30, 40, 50, 60, 70, 80, 90, 100, 110, 120, 130, 140, 150, 160, 170, 180, 190, or 200 according to one example, in the range of about 20 to about 200 according to another example, and in the range of about 20 to about 180 according to still another example, but the present invention is not limited thereto.

Oxidation Preventing Layer

The oxidation preventing layer may be formed on the surface-treated layer. The oxidation preventing layer may contain Ni and P. In addition to Ni and P, the oxidation preventing layer may further contain zinc (Zn), cobalt (Co), titanium (Ti), tin (Sn), and the like as necessary.

The deposition amount of the oxidation preventing layer may be in the range of about 30 mg/m$^2$ to about 300 mg/m$^2$ according to one example and in the range of about 50 mg/m$^2$ to about 120 mg/m$^2$ according to another example, but the present invention is not limited thereto. For example, in the oxidation preventing layer, Ni may be contained at about 15 mg/m$^2$ to about 150 mg/m$^2$ and P may be contained at about 15 mg/m$^2$ to about 150 mg/m$^2$, but the present invention is not limited thereto.

The method of forming the oxidation preventing layer is not particularly limited, but for example, the oxidation preventing layer may be formed by electroplating the copper foil including the surface-treated layer. As an electrolyte, an aqueous solution containing a Ni salt at about 10 g/L to about 30 g/L (10 g/L, 15 g/L, 20 g/L, 25 g/L, or 30 g/L according to one example and in the range of about 15 g/L to about 20 g/L according to another example) and phosphoric acid at about 20 g/L to about 60 g/L (20 g/L, 25 g/L, 30 g/L, 35 g/L, 40 g/L, 45 g/L, 50 g/L, 55 g/L, or 60 g/L according to one example and in the range of about 30 g/L to about 40 g/L according to another example) may be used. The electroplating may be carried out by, for example, immersing an insoluble electrode used as a positive electrode and the copper foil including the surface-treated layer used as a negative electrode in the electrolyte and inducing electrolysis at a solution temperature of about 25° C. to about 45° C. (e.g., 25° C., 30° C., 35° C., 40° C., or 45° C.) and a current density of about 1 A/dm2 to about 10 A/dm2 (e.g., 1 A/dm2, 2 A/dm2, 3 A/dm2, 4 A/dm2, 5 A/dm2, 6 A/dm2, 7 A/dm2, 8 A/dm2, 9 A/dm2, or 10 A/dm2) for, for example, about 1 second to about 10 seconds (e.g., 1 second, 2 seconds, 3 seconds, 4 seconds, 5 seconds, 6 seconds, 7 seconds, 8 seconds, 9 seconds, or 10 seconds), but the present invention is not limited thereto. Examples of types of the Ni salt may include nickel sulfate, nickel nitrate, nickel chloride, nickel acetate, and the like, but the present invention is not limited thereto.

According to one embodiment, the surface-treated copper foil may have an adhesive strength of about 1.0 kgf/cm or more with a polyimide (PI) film or a polytetrafluoroethylene (PTFE) film. Here, the adhesive strength may be an adhesive strength measured in accordance with the JIS C6481 standard. For example, the adhesive strength of the surface-treated copper foil with a PI film or a PTFE film may be in the range of about 1.0 kgf/cm to about 3.0 kgf/cm (1 kgf/cm, 1.1 kgf/cm, 1.2 kgf/cm, 1.3 kgf/cm, 1.4 kgf/cm, 1.5 kgf/cm, 1.6 kgf/cm, 1.7 kgf/cm, 1.8 kgf/cm, 1.9 kgf/cm, 2 kgf/cm, 2.1 kgf/cm, 2.2 kgf/cm, 2.3 kgf/cm, 2.4 kgf/cm, 2.5 kgf/cm, 2.6 kgf/cm, 2.7 kgf/cm, 2.8 kgf/cm, 2.9 kgf/cm, or 3 kgf/cm according to one example, in the range of about 1.0 kgf/cm to about 2.0 kgf/cm according to another example, and in the range of about 1.0 kgf/cm to about 1.7 kgf/cm according to still another example), but the present invention is not limited thereto.

According to one embodiment, the surface-treated copper foil may have a transmission loss (S21) of about 3.0 dB/100 mm or less at 20 GHz. Here, the "transmission loss (S21) at 20 GHz" may refer to a transmission loss measured at 20 GHz using a network analyzer after attaching the surface-treated copper foil onto both sides of a PTFE resin and forming a microstrip line so that characteristic impedance is 50Ω. For example, the transmission loss (S21) of the surface-treated copper foil as measured at 20 GHz may be in the range of about 0.5 dB/100 mm to about 3.0 dB/100 mm (0.5 dB/100 mm, 0.6 dB/100 mm, 0.7 dB/100 mm, 0.8 dB/100 mm, 0.9 dB/100 mm, 1 dB/100 mm, 1.1 dB/100 mm, 1.2 dB/100 mm, 1.3 dB/100 mm, 1.4 dB/100 mm, 1.5 dB/100 mm, 1.6 dB/100 mm, 1.7 dB/100 mm, 1.8 dB/100 mm, 1.9 dB/100 mm, 2 dB/100 mm, 2.1 dB/100 mm, 2.2 dB/100 mm, 2.3 dB/100 mm, 2.4 dB/100 mm, 2.5 dB/100 mm, 2.6 dB/100 mm, 2.7 dB/100 mm, 2.8 dB/100 mm, 2.9 dB/100 mm, or 3 dB/100 mm according to one example, in the range of about 1.0 dB/100 mm to about 3.0 dB/100 mm according to another example, and in the range of about 1.5 dB/100 mm to about 2.5 dB/100 mm according to still another example), but the present invention is not limited thereto.

The above-described surface-treated copper foil may be laminated on a resin substrate and used as a copper foil laminate, and the copper foil laminate may be used for manufacturing a printed wiring board.

Hereinafter, the present invention will be described in more detail through exemplary embodiments. However, the exemplary embodiments are presented merely as examples of the present invention and should not be construed as limiting the invention in any sense.

EXAMPLES

Example 1

After immersing a copper foil (Iljin Materials Co., Ltd.) in an aqueous solution containing copper sulfate at 25 g/L and disodium ethylenediaminetetraacetate (EDTA-2Na) at 100 g/L, electroplating was carried out under conditions of a solution temperature of 30° C., a pH of 7, and a current density of 5 A/dm2 for eight seconds, and thereby a surface-treated layer was formed on the copper foil. Subsequently, after immersing the copper foil including the surface-treated layer in an aqueous solution containing nickel sulfate at 20 g/L and phosphoric acid at 40 g/L, electroplating was carried out under conditions of a solution temperature of 30° C. and a current density of 2 A/dm2 for three seconds, forming a Ni—P oxidation preventing layer on the surface-treated layer, and thereby a surface-treated copper foil was obtained.

Example 2

A surface-treated copper foil was manufactured in the same manner as in Example 1 except that copper sulfate was used at 45 g/L and EDTA-2Na was used at 150 g/L in the formation of a surface-treated layer.

Example 3

A surface-treated copper foil was manufactured in the same manner as in Example 1 except that a current density of 6 A/dm2 was applied in the formation of a surface-treated layer.

Example 4

A surface-treated copper foil was manufactured in the same manner as in Example 1 except that copper sulfate was used at 45 g/L, EDTA-2Na was used at 150 g/L, and a current density of 6 A/dm2 was applied in the formation of a surface-treated layer.

Example 5

A surface-treated copper foil was manufactured in the same manner as in Example 1 except that a current density of 9 A/dm2 was applied in the formation of a surface-treated layer.

Example 6

A surface-treated copper foil was manufactured in the same manner as in Example 1 except that copper sulfate was used at 45 g/L, EDTA-2Na was used at 150 g/L, and a current density of 9 A/dm2 was applied in the formation of a surface-treated layer.

Comparative Example 1

A surface-treated copper foil was manufactured in the same manner as in Example 1 except that the formation of a surface-treated layer was not carried out.

Comparative Example 2

A surface-treated copper foil was manufactured in the same manner as in Example 1 except that the copper foil including the surface-treated layer was immersed in an aqueous solution containing nickel sulfate at 20 g/L and boric acid at 30 g/L and electroplating was carried out under conditions of a solution temperature of 30° C., a pH of 4, and a current density of 2 A/dm2 for four seconds, whereby a Ni oxidation preventing layer was formed on the surface-treated layer.

Comparative Example 3

After immersing a copper foil (Iljin Materials Co., Ltd.) in an aqueous solution containing copper sulfate at 27 g/L and sulfuric acid at 80 g/L, primary electroplating was carried out under conditions of a solution temperature of 30° C. and a current density of 10 A/dm2 for five seconds, the resultant was immersed in an aqueous solution containing copper sulfate at 200 g/L and sulfuric acid at 100 g/L, and secondary electroplating was carried out under conditions of a solution temperature of 30° C. and a current density of 10 A/dm2 for six seconds, and thereby a surface-treated layer was formed on the copper foil. Subsequently, after immersing the copper foil including the surface-treated layer in an aqueous solution containing nickel sulfate at 20 g/L and phosphoric acid at 40 g/L, electroplating was carried out under conditions of a solution temperature of 30° C. and a current density of 2 A/dm2 for three seconds, and thereby a Ni—P oxidation preventing layer was formed on the surface-treated layer, and thereby a surface-treated copper foil was obtained.

Comparative Example 4

A surface-treated copper foil was manufactured in the same manner as in Comparative Example 3 except that copper sulfate was used at 35 g/L, sulfuric acid was used at 70 g/L, and a current density of 25 A/dm2 and a plating time of four seconds were applied during primary electroplating and a plating time of five seconds was applied during secondary electroplating.

Comparative Example 5

A surface-treated copper foil was manufactured in the same manner as in Comparative Example 3 except that a current density of 30 A/dm2 and a plating time of six seconds were applied during primary electroplating.

Physical properties of the surface-treated copper foils manufactured in Examples and Comparative Examples were evaluated by the following physical property evaluation methods, and the results are shown in Table 1.

Physical Property Evaluation Methods (1) 10-point average roughness, Rz (units: μm): Using a surface roughness tester, the 10-point average roughness, Rz, of a copper foil before and after surface treatment was measured in accordance with the JIS B0601 standard.

(2) Average particle diameter of copper particles (units: nm): After taking an SEM image of a surface of a copper foil after surface treatment using an SEM, particle diameters of 100 copper particles within a 100 μm×100 μm area were measured, and an average value was calculated.

(3) Gloss (Gs 60°): The gloss of a surface of a copper foil after surface treatment was measured in accordance with the JIS Z 8741 standard.

(4) Adhesive strength (units: kgf/cm): The adhesive strength of a surface-treated copper foil was measured in accordance with the JIS C6481 standard.

(5) Transmission loss (S21) (units: dB/100 mm): After attaching a surface-treated copper foil having a thickness of 12 μm onto both sides of a Teflon resin (AGC Chemicals) and then forming a microstrip line so that characteristic impedance was 50Ω, transmission loss was determined at 20 GHz using a network analyzer commercially available from HP.

(6) Discoloration due to heat: After thermally treating a surface-treated copper foil at 200° C. for 30 minutes, the occurrence of discoloration was visually determined. An "○" was marked when discoloration was observed, and an "x" was marked when discoloration was not observed.

TABLE 1

| | $R_z$, before surface treatment (μm) | $R_z$, after surface treatment (μm) | Average particle diameter of copper particles (nm) | Gloss (Gs 60°) | Adhesive strength (kgf/cm) | $S_{21}$ @ 20 GHz (dB/100 mm) | Discoloration due to heat |
|---|---|---|---|---|---|---|---|
| Example 1 | 0.43 | 0.43 | 90 | 245 | 1.02 | 2.5 | x |
| Example 2 | 0.37 | 0.40 | 57 | 370 | 1.32 | 1.9 | x |
| Example 3 | 0.38 | 0.44 | 55 | 276 | 1.37 | 2.2 | x |
| Example 4 | 0.37 | 0.37 | 79 | 324 | 1.24 | 2.5 | x |
| Example 5 | 0.31 | 0.38 | 97 | 251 | 1.56 | 2.1 | x |
| Example 6 | 0.33 | 0.41 | 82 | 220 | 1.22 | 2.3 | x |
| Comparative Example 1 | 0.33 | — | — | 397 | 0.87 | 2.0 | x |
| Comparative Example 2 | 0.38 | 0.39 | 75 | 266 | 0.97 | 3.1 | ○ |
| Comparative Example 3 | 0.47 | 0.87 | 120 | 71 | 1.97 | 2.8 | x |
| Comparative Example 4 | 1.01 | 1.27 | 175 | 45 | 1.68 | 3.0 | x |
| Comparative Example 5 | 1.12 | 1.57 | 274 | 12 | 1.57 | 3.7 | x |

Referring to Table 1, it can be seen that in the case of Examples 1 to 6 which were consistent with the present invention in terms of average particle diameters of copper particles contained in surface-treated layers, the 10-point average roughness, Rz, and gloss of surface-treated layers, and types of elements contained in oxidation preventing layers, the surface-treated copper foils had excellent adhesive strength and low transmission loss at a frequency of 20 GHz compared to the case of Comparative Examples 1 to 5, which were not consistent with the present invention, and were suitable as high-frequency foils. In addition, it can be seen that in the case of Comparative Example 2 in which an oxidation preventing layer different from an Ni—P oxidation preventing layer of the present invention was used, discoloration due to heat occurred.

Hereinabove, the present invention has been described through exemplary embodiments. However, those of ordinary skill in the art to which the present invention pertains will be able to understand that the present invention can be implemented in a modified form without departing from the essential characteristics of the present invention. Therefore, the disclosed exemplary embodiments should be considered from an illustrative viewpoint rather than a restrictive viewpoint. The scope of the present invention is shown in the claims rather than the foregoing description, and all differences falling within the scope of equivalents of the claims should be construed as being included in the present invention.

REFERENCE NUMERALS

100: Surface-treated copper foil
10: Copper foil
20: Surface-treated layer
30: Oxidation preventing layer

What is claimed is:

1. A surface-treated copper foil comprising:
a surface-treated layer formed on at least one side of an untreated copper foil; and
an oxidation-preventing layer formed on the surface-treated layer,
wherein the surface-treated layer is formed by Cu-electroplating at a current density of about 5 A/dm$^2$ to about 10 A/dm$^2$,
wherein the surface-treated layer has a transmission loss of about 0.5 dB/100 mm to about 2.5 dB/100 mm at 20 GHz,
wherein the surface-treated layer contains copper particles having an average particle diameter of about 10 nm to about 100 nm and has a 10-point average roughness, Rz, of about 0.2 μm to about 0.5 μm and a gloss (Gs 60°) of about 200 or more, and the oxidation preventing layer contains nickel (Ni) and phosphorus (P).

2. The surface-treated copper foil of claim 1, wherein the untreated copper foil is an electrolytic copper foil.

3. The surface-treated copper foil of claim 1, which satisfies Formula 1:

about 0 μm≤$A_2$−$A_1$≤about 0.2 μm  <Formula 1> wherein Formula 1, $A_1$ is a 10-point average roughness, $R_z$, before surface treatment of the copper foil, and $A_2$ is a 10-point average roughness, $R_z$, after surface treatment of the copper foil.

4. The surface-treated copper foil of claim 1, which satisfies Formula 2:

about 10≤$B_1$−$B_2$≤about 200  <Formula 2> wherein Formula 2, $B_1$ is a gloss (Gs 60°) before surface treatment of the copper foil, and $B_2$ is a gloss (Gs 60°) after surface treatment of the copper foil.

5. The surface-treated copper foil of claim 1, wherein the surface-treated copper foil has an adhesive strength of about 1.0 kgf/cm or more with a polyimide (PI) film or a polytetrafluoroethylene (PTFE) film.

6. The surface-treated copper foil of claim 1, wherein the surface-treated copper foil has a transmission loss ($S_{21}$) of about 3.0 dB/100 mm or less at 20 GHz.

7. A method of manufacturing the surface-treated copper foil of claim 1, comprising immersing an untreated copper foil in an aqueous solution containing a copper salt at about 10 g/L to about 60 g/L and an additive at about 50 g/L to about 200 g/L and carrying out electroplating at a solution temperature of about 25° C. to about 45° C., a pH of about 1 to about 7, and a current density of about 5 A/dm$^2$ to about 10 A/dm$^2$ and thus forming a surface-treated layer,
  wherein the copper salt includes copper sulfate, copper nitrate, copper chloride, copper acetate, or a combination thereof, and the additive includes citric acid, ethylenediaminetetraacetic acid, nitrilotriacetic acid, tartaric acid, a salt thereof, or a combination thereof.

8. A copper foil laminate, in which the surface-treated copper foil of claim 1 is laminated on a resin substrate.

9. A printed wiring board formed using the copper foil laminate of claim 8.

* * * * *